(12) United States Patent
Wang et al.

(10) Patent No.: US 9,496,514 B2
(45) Date of Patent: Nov. 15, 2016

(54) ORGANIC LIGHT-EMITTING DEVICE AND FABRICATION METHOD FOR THE SAME, AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Bo Wang, Beijing (CN); Minghua Xuan, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/573,340

(22) Filed: Dec. 17, 2014

(65) Prior Publication Data
US 2016/0118610 A1    Apr. 28, 2016

(30) Foreign Application Priority Data
Oct. 27, 2014    (CN) .......................... 2014 1 0584962

(51) Int. Cl.
*H01L 51/50* (2006.01)
*H01L 27/32* (2006.01)

(52) U.S. Cl.
CPC ......... *H01L 51/5012* (2013.01); *H01L 27/322* (2013.01)

(58) Field of Classification Search
CPC . H01L 51/504; H01L 27/32; H01L 51/5092; H01L 51/5072; H01L 51/56; H01L 51/5056; H01L 51/5088
See application file for complete search history.

(56) References Cited

FOREIGN PATENT DOCUMENTS

| CN | 1937277 A | 3/2007 |
|---|---|---|
| CN | 101630721 A * | 1/2010 |
| CN | 102270751 A | 12/2011 |

OTHER PUBLICATIONS

First Chinese Office Action Appln. No. 201410584962.6; Dated Jul. 7, 2015.
Second Chinese Office Action dated Sep. 29, 2015; Appln. No. 201410584962.6.
Fourth Chinese Office Action dated Apr. 5, 2016; Appln. No. 201410584962.6.
Third Chinese Office Action dated Jan. 12, 2016; Appln. No. 201410584962.6.

* cited by examiner

*Primary Examiner* — John P Dulka
(74) *Attorney, Agent, or Firm* — Ladas & Parry LLP

(57) ABSTRACT

The disclosure provides an organic light-emitting device, a fabrication method thereof, and a display device. The organic light-emitting device comprises an anode layer, a cathode layer, and an organic function layer disposed between the anode layer and the cathode layer. The organic function layer comprises a light-emitting layer. The light-emitting layer comprises a first sub light-emitting layer and a second sub light-emitting layer disposed adjacent to each other, the first sub light-emitting layer is provided on an anode layer side and the second sub light-emitting layer is provided on a cathode layer side. The first sub light-emitting layer and the second sub light-emitting layer have a substantially same energy band difference, and one of the first sub light-emitting layer and the second sub light-emitting layer is capable of absorbing light emitted by the other of the first sub light-emitting layer and the second sub light-emitting layer to achieve stimulated emission.

10 Claims, 3 Drawing Sheets

ORGANIC LIGHT-EMITTING DEVICE AND FABRICATION METHOD FOR THE SAME, AND DISPLAY DEVICE

TECHNICAL FIELD

Embodiments of the disclosure relate to an organic light-emitting device and a fabrication method for the same, and a display device.

BACKGROUND

An Organic Light-Emitting Device (OLED) is a light-emitting device taking an organic solid-state semiconductor as a light emitting material, and it has a broad prospect for application due to advantages such as simple fabrication process, low cost, low power consumption, high brightness, and wide range of operating temperature.

The OLED typically comprises an anode layer, a cathode layer and a light-emitting layer disposed between the anode layer and the cathode layer. A light-emitting mechanism of the OLED is as follows: when a voltage is applied between the anode layer and the cathode layer, holes injected from the anode layer side overcome an interface potential barrier and are transmitted to the light-emitting layer, electrons injected from the cathode layer side overcome an interface potential barrier and are transmitted to the light-emitting layer, the holes and the electrons arriving at the light-emitting layer recombine in the light-emitting layer to form excitons, and the excitons jumps to a lower energy state to emit light, which is called electroluminescence. In this process, if an excited-state electron spin pairs up with a ground-state electron, the exciton is a singlet and light emitted thereby is so-called fluorescence; if the excited-state electron spin and the ground-state electron are unpaired and parallel, the exciton is a triplet and light emitted thereby is so-called phosphorescence.

SUMMARY

At least one embodiment of the disclosure provides an organic light-emitting device. The organic light-emitting device comprises an anode layer, a cathode layer, and an organic function layer disposed between the anode layer and the cathode layer. The organic function layer comprises a light-emitting layer. The light-emitting layer comprises a first sub light-emitting layer and a second sub light-emitting layer disposed adjacent to each other, the first sub light-emitting layer is provided on an anode layer side and the second sub light-emitting layer is provided on a cathode layer side. The first sub light-emitting layer and the second sub light-emitting layer have a substantially same energy band difference, and one of the first sub light-emitting layer and the second sub light-emitting layer is capable of absorbing light emitted by the other of the first sub light-emitting layer and the second sub light-emitting layer to achieve stimulated emission.

Another embodiment of the disclosure provides a display device. The display device comprises the above-described organic light-emitting device.

Still another embodiment of the disclosure provides a fabrication method for an organic light-emitting device. The fabrication method for an organic light-emitting device comprises respectively forming an anode, a light-emitting layer and a cathode. The forming the light-emitting layer comprises: forming a first sub light-emitting layer, the first sub light-emitting layer being disposed on an anode side; forming a second sub light-emitting layer adjacent to the first sub light-emitting layer, the second sub light-emitting layer being disposed on a cathode side. The first sub light-emitting layer and the second sub light-emitting layer have a substantially same energy band difference, and one of the first sub light-emitting layer and the second sub light-emitting layer is capable of absorbing light emitted by the other of the first sub light-emitting layer and the second sub light-emitting layer to achieve stimulated emission.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the disclosure belongs. The terms "first," "second," etc., which are used in the description and the claims of the disclosure, are not intended to indicate any sequence, amount or importance, but distinguish various components. Also, the terms such as "a," "an," etc., are not intended to limit the amount, but indicate the existence of at least one. Wordings of "connecting" or "connected" and the like are not limited to physical or mechanical connections, but may comprise electrical connection, either direct or indirect.

In the present disclosure, a HOMO and a LUMO refer to a Highest Occupied Molecular Orbital and a Lowest Unoccupied Molecular Orbital, respectively. According to a frontier orbital theory, both of the HOMO and the LUMO are collectively referred to as a frontier orbital. The HOMO in an organic semiconductor is similar to a valence band in an inorganic semiconductor, and the LUMO in the organic semiconductor is similar to a conduction band in the inorganic semiconductor. An energy difference between the HOMO and the LUMO is referred to as "an energy band difference", and the energy band difference is equal to "HOMO-LUMO", which can be used to determine whether an organic molecule is easily excited. The smaller the energy band difference of the organic molecule, the more easily the organic molecule is excited.

Figure 1:
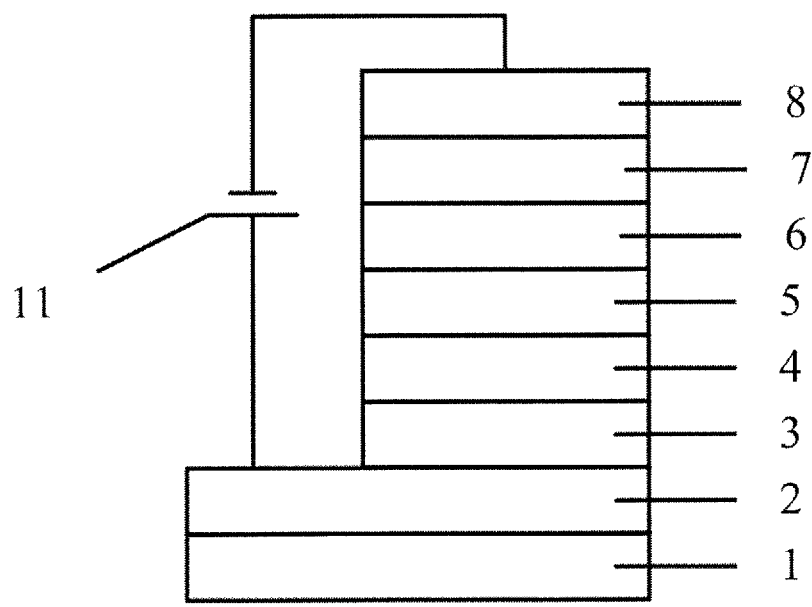
FIG. 1 illustrates a structure of an OLED.

FIG. 1 illustrates a structure of an OLED. The OLED comprises a substrate 1, an anode layer 2, a cathode layer 8 and an organic function layer disposed between the anode layer 2 and the cathode layer 8. The organic function layer comprises a hole injection layer (HIL) 3, a hole transport layer (HTL) 4, a light-emitting layer (EML) 5, an electron transport layer (ETL) 6 and an electron injection layer (EIL) 7 sequentially disposed on the anode layer 2. The hole injection layer 3 is adjacent to the anode layer 2, and the electron injection layer 7 is adjacent to the cathode layer 8. An external direct-current power supply 11 is connected between the anode layer 2 and the cathode layer 10; and the organic light-emitting device emits light under the driven of the external direct-current power supply 11.

Figure 2:
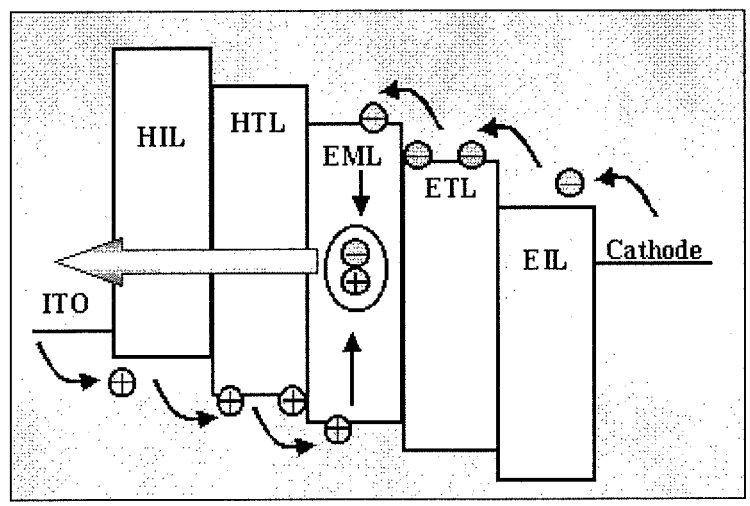
FIG. 2 illustrates an energy level of the OLED illustrated in FIG. 1.

FIG. 2 illustrates an energy level of the OLED illustrated in FIG. 1. When a voltage is applied between the anode layer 2 and the cathode layer 8, under the driven of the external voltage, holes injected from the anode layer 2 overcome an interface potential barrier to enter the HOMO energy levels of the hole injection layer 3 and the hole transport layer 4 and arrive at the light-emitting layer 5, electrons injected from the cathode layer 10 overcome an interface potential barrier to enter the LUMO energy levels of the electron injection layer 7 and the electron transport layer 6 and arrive at the light-emitting layer 5, the holes and the electrons arriving at the light-emitting layer 5 recombine in a recombination region to form excitons in an exited state. The excitons in such excited state are unstable and render radiative transition, and thus electroluminescence occurs. In the drawings, the anode being indium tin oxide (ITO) is taken as an example.

It is a problem in the current organic light emitting field to make a full use of energy released by recombination of electrons and holes and to improve utilization efficiency of the carriers in the OLED so as to enhance luminescence efficiency of the organic light-emitting device.

Meanwhile, the inventor has also noted that, in a pixel unit of an active matrix OLED (AMOLED) display device, among red, green and blue (RGB) sub-pixels achieved by different luminescent materials, red and green luminescent materials have high luminescence efficiency, whereas blue luminescent material has low luminescence efficiency. Thus, the blue luminescent material is needed to have a larger area to achieve a balance of RGB, but in such case, the design of a drive circuit is limited and the display device with a higher resolution is difficult to be achieved.

One embodiment of the disclosure provides an Organic Light-Emitting Device (OLED), comprising an anode layer, a cathode layer, and an organic function layer disposed between the anode layer and the cathode layer. The organic function layer comprises a light-emitting layer; the light-emitting layer comprises two sub light-emitting layers disposed adjacent to each other, i.e., a first sub light-emitting layer on an anode layer side and a second sub light-emitting layer on a cathode layer side; the first sub light-emitting layer and the second sub light-emitting layer have a substantially same energy band difference, and one of the first sub light-emitting layer and the second sub light-emitting layer is capable of absorbing light emitted by the other sub light-emitting layer to achieve stimulated emission. The "substantially same" in the disclosure refers to that a difference between absolute values of the energy band differences of the two sub light-emitting layers with respect to the smaller one is less than 5%, preferably less than 3%. In one example, energy band differences of the first sub light-emitting layer and the second sub light-emitting layer are the same.

In the embodiment of the disclosure, the light-emitting layer of the OLED comprises at least two sub light-emitting layers and the at least two sub light-emitting layers have a substantially same energy band difference, so that a structure similar to quantum well is obtained. Thereby, in the process that one layer of the at least two sub light-emitting layers emits light due to recombination, the other layer of the at least two sub light-emitting layers is capable of absorbing energy of a portion of emitted light to autonomously implement stimulated emission and emit light with a corresponding wavelength. For example, in the at least two sub light-emitting layers, at least the first sub light-emitting layer uses the energy of the light emitted from the previous layer as an excitation source to achieve light emission.

For example, the first sub light-emitting layer is made of a host luminescent material, and the second sub light-emitting layer is made of a doped host luminescent material; or the second sub light-emitting layer is made of the host luminescent material, and the first sub light-emitting layer is made of the doped host luminescent material.

For example, the first sub light-emitting layer is made of the doped host luminescent material having a first doping concentration, and the second sub light-emitting layer is made of the doped host luminescent material having a second doping concentration.

For example, a luminescence efficiency of the second sub light-emitting layer is lower than a luminescence efficiency of the first sub light-emitting layer.

For example, an emission wavelength of the first sub light-emitting layer is substantially same as an emission wavelength of the second sub light-emitting layer. Here, the "substantially same" refers to that a difference between absolute values of the emission wavelengths of the two sub light-emitting layers with respect to the smaller one is less than 5%, preferably less than 3%. In one example, emission wavelengths of the first sub light-emitting layer and the second sub light-emitting layer are the same.

For example, a thickness ratio of the first sub light-emitting layer to the second sub light-emitting layer is 1:3~3:1.

For example, the light-emitting layer further comprise a third sub light-emitting layer disposed adjacent to the second sub light-emitting layer, the third sub light-emitting layer is disposed on a side of the second sub light-emitting layer facing the cathode, the third sub light-emitting layer and the second sub light-emitting layer have a substantially same energy band difference, and one of the second sub light-emitting layer and the third sub light-emitting layer is capable of absorbing light emitted by the other sub light-emitting layer to achieve stimulated emission. For example, the first sub light-emitting layer is made of the host luminescent material, the second sub light-emitting layer and the third sub light-emitting layer are made of the doped host luminescent material, and a doping concentration of the second sub light-emitting layer differs from a doping concentration of the third sub light-emitting layer. Alternatively, the third sub light-emitting layer is made of the host luminescent material, the first sub light-emitting layer and the second sub light-emitting layer are made of the doped host luminescent material, and a doping concentration of the first sub light-emitting layer differs from a doping concentration of the second sub light-emitting layer.

For example, the first sub light-emitting layer is made of the doped host luminescent material having a first doping concentration; the second sub light-emitting layer is made of the doped host luminescent material having a second doping concentration; and the third sub light-emitting layer is made of the doped host luminescent material having a third doping concentration.

Figure 3:
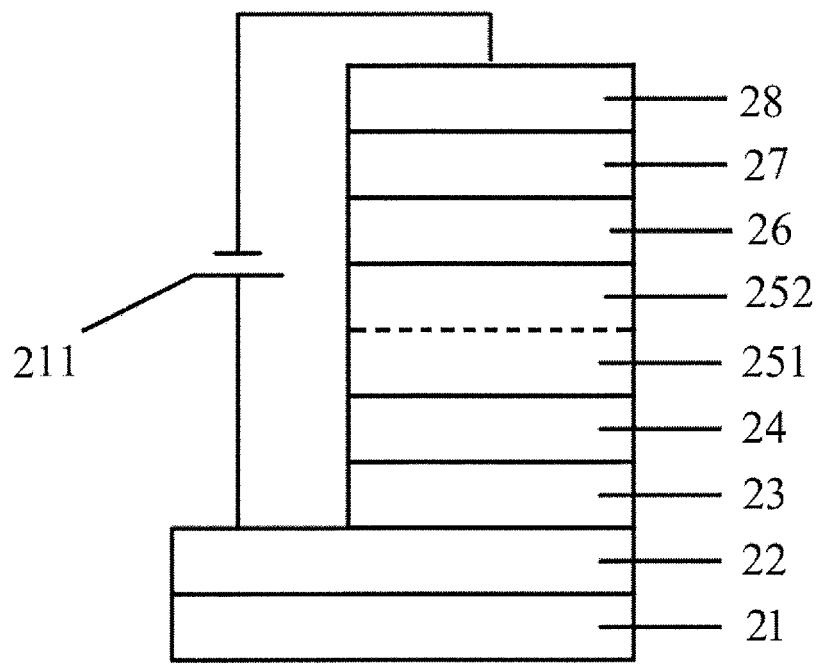
FIG. 3 illustrates a structure of an OLED according to an embodiment of the disclosure.

FIG. 3 illustrates a structure of an OLED according to an embodiment of the disclosure. The OLED comprises a substrate 21, an anode layer 22, a cathode layer 28 and an organic function layer disposed between the anode layer 22 and the cathode layer 28. In the embodiment, the organic function layer comprises a hole injection layer (HIL) 23, a hole transport layer (HTL) 24, a light-emitting layer (EML), an electron transport layer (ETL) 26 and an electron injection layer (EIL) 27 sequentially disposed on the anode layer 22. The hole injection layer 23 is adjacent to the anode layer 22, and the electron injection layer 27 is adjacent to the cathode layer 28. An external direct-current power supply 211 is connected between the anode layer 22 and the cathode layer 28; and the organic light-emitting device emits light under the driven of the external direct-current power supply 211.

The substrate 21 is configured as a support structure of the electrode layer and the organic function layer, has a certain capability of preventing permeation of water vapor and oxygen, and has a better surface smoothness. For example, the substrate 21 is a glass substrate, a quartz substrate, a flexible substrate, or a TFT array substrate. As for the OLED of bottom reflection type, the substrate 21 should be transparent. The flexible substrate may be made of a material selected from polyesters and poly(phthalimide) compounds, or the flexible substrate may be made of a thin metal.

The anode layer 22 severs as a forward-voltage connection layer of the OLED and has a good electrical conductivity, a visible-light transparency and a relatively high work-function value. For example, the anode layer 22 is made of inorganic metal oxide (e.g., indium tin oxide (ITO), zinc oxide (ZnO), etc.), or organic conductive polymer (e.g., PEDOT: PSS, PANI, etc.) or a metal material having relatively high work-function value (e.g., gold, copper, silver, platinum, etc.).

The cathode layer 28 serves as a backward-voltage connection layer of the OLED and has a good electrical conductivity and a relatively low work-function value. For example, the cathode layer 28 is made of a metal material having relatively low work-function value, e.g., lithium, magnesium, calcium, strontium, aluminum, indium, etc., or an alloy of the above metal material having relatively low work-function value with copper, gold and silver.

The hole injection layer 23 may be, for example, made of triphenylamine compounds or a P-type doped organic layer or polymers, e.g., tri-[4-(5-phenyl-2-thienyl)phenyl]amine, 4,4',4"-tris[2-naphthyl(phenyl)amino]triphenylamine(2-TNATA) or 4,4',4"-tris-(3-methylphenylphenylamino)triphenylamine(m-MTDATA), copper phthalocyanine (CuPc), Pedot:Pss, TPD or F4TCNQ.

The hole transport layer 24 may be, for example, made of aromatic diamine compounds, triphenylamine compounds, aromatic triamine compounds, benzidine derivatives, triarylamine polymers, and carbazole polymers, for example, NPB, TPD, TCTA, and polyvinyl carbazole or the monomer thereof.

The electron transport layer 26 may be, for example, made of phenanthroline derivatives, oxazole derivatives, thiazole derivatives, imidazole derivatives, metal complexes, or anthracene derivatives. Specific examples comprise: 8-hydroxyquinoline aluminum (Alq3), 8-hydroxyquinoline lithium (Liq), 8-hydroxyquinoline gallium, bis[2-(2-hydroxyphenyl-1)-pyridine]beryllium, 2-(4-diphenyl)-5-(4-tert-butylphenyl)-1,3,4-oxadiazole (PBD), 1,3,5-tri(N-phenyl-2-benzimidazole-2)benzene (TPBI), BCP, Bphen, etc.

The electron injection layer 27 may be, for example, made of alkali metal oxides, alkali metal fluorides, etc. The alkali metal oxides comprise lithium oxide (Li2O), lithium boron oxide (LiBO), potassium silicate (K2SiO3), cesium carbonate (Cs2CO3), etc.; and the alkali metal fluorides comprise lithium fluoride (LiF), sodium fluoride (NaF), etc.

In the embodiment shown in FIG. 3, the anode layer 22 is formed on the substrate as a lower electrode, while the cathode layer 28 is formed on the organic function layer as an upper electrode. However, embodiments of the disclosure are not limited thereto, the cathode layer may be formed on the substrate as the lower electrode, while the anode layer may be formed on the organic function layer as the upper electrode. Further, an intermediate layer may further be formed between the lower electrode and the substrate as required, and the intermediate layer for example may be a buffer layer or a reflective layer for the OLED of top emission type. The OLED in the embodiments of the disclosure may be formed as a top emission type, a bottom emission type or a double-sided emission type as required.

The light-emitting layer in the embodiment shown in FIG. 3 comprises two sub light-emitting layers: the first sub light-emitting layer 251 on the anode layer 22 side, the second sub light-emitting layer 252 on the cathode layer 28 side. The first sub light-emitting layer 251 and the second sub light-emitting layer 252 have a substantially same energy band difference (i.e., HOMO-LUMO), and light emitted by the second sub light-emitting layer 252 is capable of being absorbed by the first sub light-emitting layer 251 to achieve stimulated emission. The first sub light-emitting layer 251 utilizes light emitted by the second sub light-emitting layer 252 as an excitation source to achieve light emission. Alternatively, light emitted by the first sub light-emitting layer 251 is capable of being absorbed by the second sub light-emitting layer 252 to achieve stimulated emission.

Figure 4:
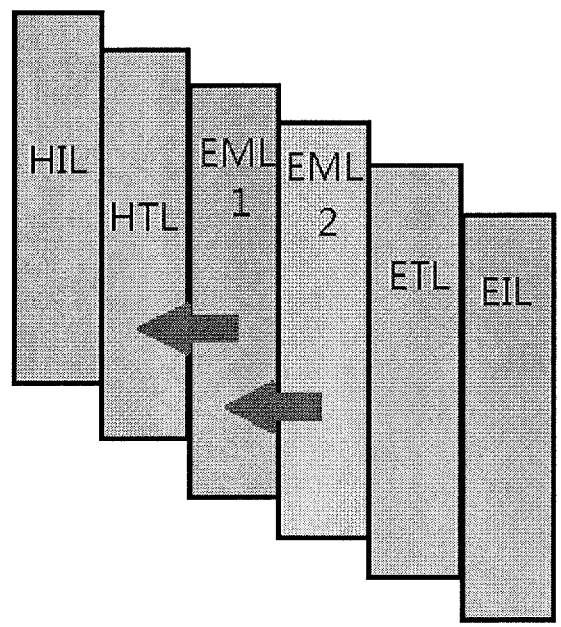
FIG. 4 illustrates an energy level of the OLED illustrated in FIG. 3.

FIG. 4 illustrates a structural schematic diagram of an energy level of the OLED shown in FIG. 3. As shown in FIG. 4, an energy band difference of the second sub light-emitting layer 252 is substantially same as an energy band difference of the first sub light-emitting layer 251; energy levels of the second sub light-emitting layer 252 are lower than energy levels of the first sub light-emitting layer 251 (that is, there is an energy level difference between the first sub light-emitting layer 251 and the second sub light-emitting layer 252), otherwise the carriers cannot be injected. The HOMO and the LUMO of the second sub light-emitting layer 252 are respectively lower than the HOMO and the LUMO of the first sub light-emitting layer 251, for example, lower by 0.5 ev or less, further for example, lower by 0.2~0.5 ev. When the second sub light-emitting layer 252 emits light, the first sub light-emitting layer 251 absorb energy of a portion of photons emitted by the second sub light-emitting layer 252 to achieve an avalanche effect and achieve recombination emission.

For example, the light-emitting layer, depending on the used luminescent materials, emit red light, green light, blue light, yellow light, white light, etc., and the embodiments of the disclosure do not limit the color of the light emitted by the light-emitting layer. For example, the OLED according to the embodiments of the disclosure emits blue light.

The organic luminescent material generally is classified into fluorescent material and phosphorescent material, both of which may be doped. For example, the available luminescent material generally is obtained by mixing a dopant material in a host luminescent material. For example, the host luminescent material may be metal complex materials, anthracene derivatives, aromatic diamine compounds, triphenylamine compounds, aromatic triamine compounds, biphenyl diamine derivatives, or triarylamine polymers; more specifically, for example, bis(2-methyl-8-hydroxyquinoline-N1, O8)-(1,1'-biphenyl-4-hydroxy)aluminum (Balq), 9,10-bis-(2-naphthyl)anthracene(ADN), TAZ, 4,4'-bis(9-carbazolyl)biphenyl (CBP), MCP, 4,4',4''-tris-9-carbazolyl triphenylamine (TCTA) or N,N-bi($\alpha$-naphthyl-phenyl)-4,4-benzidine (NPB), etc. The fluorescent luminescent material or the dopant material, for example, comprises coumarin dyes (coumarin 6, C-545T), quinacridone (DMQA), or 4-(dicyanomethylene)-2-methyl-6-(4-dimethylamino-styrene)4H-pyran (DCM) series, etc. The phosphorescent material or the dopant material, for example, comprises luminescent materials based on Ir, Pt, Ru, Cu and other metal complexes, e.g., FIrpic, Fir6, FirN4, FIrtaz, Ir(ppy)3, Ir(ppy)2(acac), PtOEP, (btp)2Iracac, Ir(piq)2(acac) or (MDQ)2Iracac, etc. Further, the luminescent material may comprise two host luminescent materials which are doped.

In one embodiment of the disclosure, for example, the second sub light-emitting layer 252 is formed of an undoped luminescent material and has a lower luminescence efficiency; and the first sub light-emitting layer 251 is formed of a doped luminescent material and has a higher luminescence efficiency. For example, when the light-emitting layer emits red light, the red luminescent material may be fluorescent material or phosphorescent material; in one example, the luminescent material of the second sub light-emitting layer 252 is DCM, and the luminescent material of the first sub light-emitting layer 251 is DCM doped with Alq (quinoline-aluminum) and a doping concentration is 1 to 5% wt (e.g., 3% wt). For example, the first sub light-emitting layer and the second sub light-emitting layer have a thickness of 5~50 nm, and more specifically, 10~30 nm.

For example, when the light-emitting layer emits blue light, the blue luminescent materials may be fluorescent material or phosphorescent material; in one example, the luminescent material of the second sub light-emitting layer 252 is DPUBi (4,4'-bis(2,2'-diphenyl vinyl)-1,1'-biphenyl), and the luminescent material of the first sub light-emitting layer 251 is DPUBi doped with rubrene and a doping concentration is 1 to 5% wt (e.g., 3% wt).

In another embodiment of the disclosure, a doping concentration of the first sub light-emitting layer 251 differs from a doping concentration of the second sub light-emitting layer 252, and the first sub light-emitting layer 251 has a higher luminescence efficiency. For example, when the light-emitting layer emits red light, the first sub light-emitting layer and the second sub light-emitting layer are AND doped with 2,6-bis[(4'-methoxy-biphenyl-amino)styrene-1,5-]dicyanonaphthalene (BSN), a doping concentration of the first sub light-emitting layer is 30% wt, a doping concentration of the second sub light-emitting layer is 20% wt, and the first sub light-emitting layer and the second sub light-emitting layer have a thickness of 5~50 nm. For example, when the light-emitting layer emits blue light, the first sub light-emitting layer and the second sub light-emitting layer are AND doped with 4,4-bis[2-[4-(N,N-biphenyl amino)phenyl]-vinyl]biphenyl (DPAVBi), a doping concentration of the first sub light-emitting layer is 2.5% wt, a doping concentration of the second sub light-emitting layer is 1.5% wt, and the first sub light-emitting layer and the second sub light-emitting layer have a thickness of 5~50 nm.

In still another embodiment of the disclosure, both the first sub light-emitting layer 251 and the second sub light-emitting layer 252 are formed of two doped fluorescent materials, and the first sub light-emitting layer 251 has a higher luminescence efficiency. For example, when the light-emitting layer emits red light, the first sub light-emitting layer and the second sub light-emitting layer are formed of 2-tert-butyl-9,10-di(2-naphthyl)anthracene (TBADN): Alq3: 4-(dicyanomethylene)-2-tert-butyl-6-(1,1, 7,7-tetramethyljulolidinyl-4-vinyl)-4H-pyran (DCJTB), in which the former two are the host materials, and the latter is the dopant material; for example, doping concentrations of the first sub light-emitting layer and the second sub light-emitting layer are respectively 1% wt and 3% wt. In another embodiment, the first sub light-emitting layer and the second sub light-emitting layer are formed of Alq3: rubrene: DCJTB, in which the first two are the host materials, and the last one is the dopant material; for example, doping concentrations of the first sub light-emitting layer and the second sub light-emitting layer are respectively 2% wt and 3% wt.

Compared with the OLED which only uses the first sub light-emitting layer 251 or the second sub light-emitting layer 252, the OLED according to the embodiment shown in FIG. 4 has a luminescence efficiency increased by more than 30%.

Figure 5:
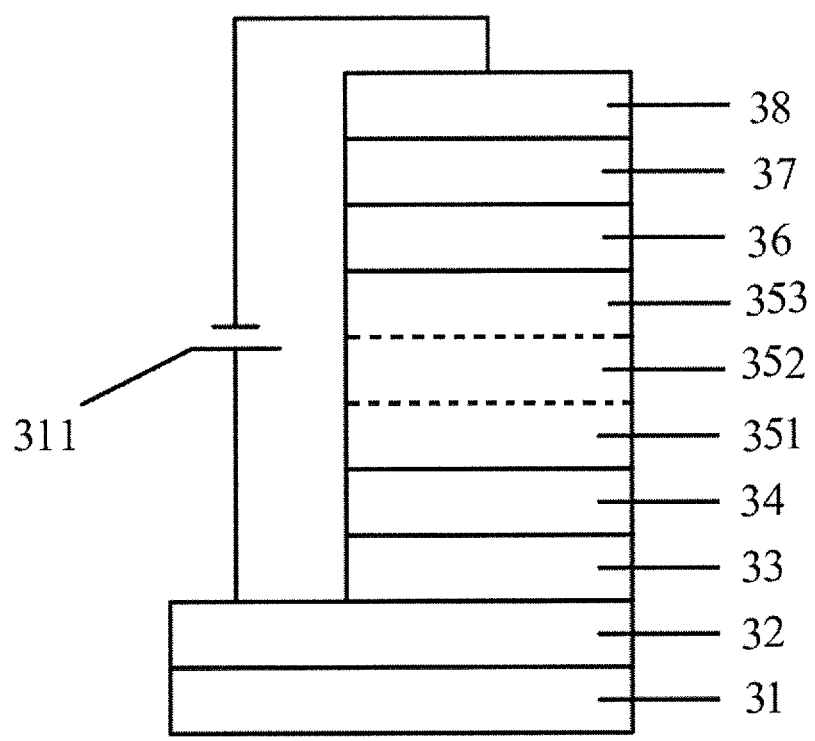
FIG. 5 illustrates a structure of an OLED according to another embodiment of the disclosure.

FIG. 5 illustrates a structure of an OLED according to another embodiment of the disclosure. The OLED comprises a substrate 31, an anode layer 32, a cathode layer 38 and an organic function layer disposed between the anode layer 32 and the cathode layer 38. In the embodiment, the organic function layer comprises a hole injection layer (HIL) 33, a hole transport layer (HTL) 34, a light-emitting layer (EML), an electron transport layer (ETL) 36 and an electron injection layer (EIL) 37 sequentially disposed on the anode layer 32. The hole injection layer 33 is adjacent to the anode layer 32, and the electron injection layer 37 is adjacent to the cathode layer 38. An external direct-current power supply 311 is connected between the anode layer 32 and the cathode layer 38; and the organic light-emitting device emits light under the driven by the external direct current power supply 311. The hole injection layer, the hole transport layer, the electron injection layer, the electron transport layer, and the electron injection layer in the embodiment may be made of the corresponding materials as described above.

The light-emitting layer according to the embodiment shown in FIG. 5 comprises three sub light-emitting layers: a first sub light-emitting layer 351, a second sub light-emitting layer 352 and a third sub light-emitting layer 353 sequentially provided from the anode layer 32 side to the cathode layer 38 side. The first to third sub light-emitting layers 351-353 have a substantially same energy band difference. The first to third sub light-emitting layers 351-353 have energy level differences; for example, the energy levels of the first to third sub light-emitting layers 351-353 gradually decrease according to the frontier orbital energy level. For example, the energy level difference of adjacent sub light-emitting layers is 0.5 ev or less, further for example, 0.2~0.5 ev or less. For example, light emitted by the third sub light-emitting layer 353 is capable being absorbed by the second sub light-emitting layer 252 to achieve stimulated emission; and/or, light emitted by the second sub light-emitting layer 352 is capable of being absorbed by the first sub light-emitting layer 351 to achieve stimulated emission. For example, at least the first sub light-emitting layer 251 and/or the second sub light-emitting layer 252 utilize photon energy of light emitted by the adjacent sub light-emitting layer as an excitation source to achieve light emission.

In the embodiment shown in FIG. 5, the first to third sub light-emitting layers 351-353 may be made of the materials as described above. For example, the third sub light-emitting layer is formed of an undoped luminescent material and has a lower luminescence efficiency, while the second sub light-emitting layer and the first sub light-emitting layer are formed of doped luminescent materials and have a higher luminescence efficiency, and doping concentrations of the second sub light-emitting layer and the first sub light-emitting layer may be the same or different. Alternatively, for example, the first to third sub light-emitting layers are all formed of doped luminescent materials, but with different doping concentrations. In one embodiment, one of the second sub light-emitting layer and the third sub light-emitting layer is capable of absorbing light emitted by the other sub light-emitting layer to achieve exited emission. Compared with the OLED which only uses any one of the first to third sub light-emitting layers, the OLED according to the embodiment shown in FIG. 5 has a luminescence efficiency increased by more than 30%.

Further, based on the embodiments described in conjunction with FIG. 3 and FIG. 5, the organic function layer of the OLED according to the embodiments of the disclosure may only comprise the light-emitting layer, but do not comprise the hole injection layer, the hole transport layer, the electron transport layer, and the electron injection layer, etc. Alternatively, in addition to the light-emitting layer, the organic function layer of the OLED according to the embodiments of the disclosure may optionally comprise at least one of the hole injection layer, the hole transport layer, the electron transport layer and the electron injection layer. In addition, based on the embodiments described in conjunction with FIG. 3 and FIG. 5, the organic function layer of the OLED according to the embodiments of the disclosure may comprise an electron blocking layer and an exciton blocking layer as required, and the embodiments of the disclosure are not limited to these structures.

The light-emitting layer of the OLED according to the embodiments of the disclosure is not limited to the two-layer structure shown in FIG. 3 and three-layer structure shown in FIG. 5, and may have a structure having more sub light-emitting layers (e.g., a structure of four sub light-emitting layers). Moreover, it is not limited to the doping relationship in the embodiments as described above, as long as the sub light-emitting layers sequentially arranged in the energy level structure have a substantially same energy band difference to obtain the structure similar to quantum well so that at least one sub light-emitting layer is capable of absorbing light emitted by another sub light-emitting layer to achieve stimulated emission.

At least one embodiment of the disclosure further provides a display device. The display device comprises the above-described OLED provided by at least one embodiment of the disclosure to form sub-pixels of at least one color, such as red, green and blue (RGB) sub-pixels. These sub-pixels constitute a pixel array. For example, the display device may be a mobile phone, a tablet personal computer, a television, a monitor, a laptop computer, a digital photo frame, a navigator, a watch, or any other products or components having a display function.

At least one embodiment of the disclosure provides a fabrication method for an OLED. For example, the method comprises steps as follows.

S1) Cleaning a substrate;

In one example, the substrate 21 is cleaned sequentially in cleaning agent, ethanol solution, acetone solution and deionized water, and then dried with dry nitrogen.

S2) forming an anode layer or a cathode layer;

The substrate 21 is placed in a vacuum evaporation chamber, to form the anode layer 22 or the cathode layer 28 or to perform other processes.

In one example, the substrate 21 is transferred to the vacuum evaporation chamber and an indium tin oxide (ITO) film is formed on the substrate 21, so that the anode layer 22 of the organic light-emitting device is formed on the substrate 21. For example, a sheet resistance of the ITO film is 25 Ω/□.

Of course, in order to improve production efficiency, step S1) and step S2) may be completed in advance to form the substrate with the anode layer or the cathode layer, which is capable of being directly used in the subsequent processes.

S3) Pretreating the anode layer or the cathode layer;

In one example, the substrate 21 with the anode layer 22 is moved into the vacuum chamber, and the anode layer 22 is pretreated by using oxygen plasma or argon plasma to improve cleanliness and surface smoothness of the ITO film, enhance surface properties of the ITO film, and increase a work-function value thereof.

S4) forming an organic function layer

For example, the organic function layer is fabricated on the anode layer 22 or the cathode layer 28 after being treated. For example, the light-emitting layer comprises two sub light-emitting layers.

In one example, the treated substrate 21 is moved into the vacuum chamber, and then the organic function layer is fabricated. For example, a hole injection layer 23, a hole transport layer 24, a light-emitting layer, an electron transport layer 26 and an electron injection layer 27 are sequentially formed. For example, the light-emitting layer sequentially comprises a first sub light-emitting layer 251 and a second sub light-emitting layer 252 from bottom to top. For example, a fabrication process of the light-emitting layer may be as follows:

1) Forming the first sub light-emitting layer 251;
2) Forming the second sub light-emitting layer 252 on the first sub light-emitting layer 251.

The first sub light-emitting layer 251 and the second sub light-emitting layer 252 have a substantially same energy band difference, and one of the first sub light-emitting layer and the second sub light-emitting layer is capable of absorbing light emitted by the other sub light-emitting layer to achieve stimulated emission.

S5) forming the cathode layer or the anode layer;

For example, after forming the organic function layer, the substrate 1 is placed under a high vacuum condition to form the cathode layer 10.

Deposition rates and thicknesses of respective layers constituting the organic function layer in step S2 to step S5 as described above may be monitored by a thickness measurement device disposed near the substrate. Respective layers of the organic function layers may be fabricated by an evaporation method or a metal organic chemical vapor deposition (MOCVD) method. For example, when the light-emitting layer emits red light, the red luminescent material may be a fluorescent material or a phosphorescent material; in one example, the luminescent material of the second sub light-emitting layer is DCM, the luminescent material of the first sub light-emitting layer is DCM doped with Alq, and for example, the first sub light-emitting layer and the second sub light-emitting layer have a thickness of 5~50 nm, and further for example, 10~30 nm. For example, when the light-emitting layer emits blue light, the material emitting blue light may be a fluorescent material or a phosphorescent material; in one example, the luminescent material of the second sub light-emitting layer is DPUBi, and the luminescent material of the first sub light-emitting layer is DPUBi doped with rubrene.

Thereafter, the organic light-emitting device fabricated as described above may be transferred to a hand-operation box for encapsulation. The hand-operation box is of an inert gas atmosphere, for example, a nitrogen atmosphere. Afterwards, photoelectric properties of the organic light-emitting device fabricated as described above may be tested.

In one example of the embodiment of the disclosure, constitution of respective layers of the OLED is as follows (comprising fabricating materials/and thicknesses of the respective layers): Glass/ITO/2-TNATA (10 nm)/NPB (20 nm)/DCM (10 nm)/DCM: Alq3 (10 nm)/TPBI (40 nm)/LiF (0.5 nm)/Al (200 nm). That is, the substrate is made of glass; the anode layer is made of ITO, a vacuum degree of the vacuum evaporation chamber is set to $2\times10^{-4}$ Pa to form indium tin oxide (ITO) film on the substrate; the hole injection layer is made of 2-TNATA with a thickness of 10 nm, and for example, the evaporation rate is set to 0.08 nm/s; the hole transport layer is made of NPB; in the light-emitting layer, the first sub light-emitting layer is made of DCM as the host luminescent material with a thickness of 10 nm, the evaporation rate for example is set to 0.08 nm/s, and the second sub light-emitting layer is made of DCM as the host luminescent material doped with Alq3 with a thickness of 10 nm, and for example, the evaporation rate is set to 0.08 nm/s; the electron transport layer is made of TPBI with a thickness of 40 nm, and for example, the evaporation rate is set to 0.08 nm/s; the electron injection layer 9 is made of LiF with a thickness of 0.5 nm, and for example, the evaporation rate is set to 0.02 nm/s; the cathode layer is made of Al, and is formed in a high vacuum condition at a vacuum degree of $5\times10^{-4}$ Pa by an evaporation method. In the example, the OLED emits red light and may be of bottom emission type.

In another example of the embodiment of the disclosure, constitution of respective layers of the OLED is as follows (comprising fabricating materials/and thicknesses of the respective layers): Glass/ITO/2-TNATA (10 nm)/NPB (20 nm)/DPUBi (10 nm)/DPUBi: rubrene (10 nm)/TPBI (40 nm)/LiF (0.5 nm)/Al (200 nm). In the light-emitting layer, the first sub light-emitting layer is made of DPUBi as the host luminescent material, and the second sub light-emitting layer is made of DCM as the host luminescent material doped with rubrene. In the example, the OLED emits blue light and may be of a double-sided emission type.

In the OLED according to at least one embodiment of the disclosure, since at least one sub light-emitting layer is capable of absorbing light emitted by another light-emitting layer to achieve stimulated emission, the luminescence efficiency can be effectively improved and more efficient light emission can be achieved under the same drive current. The problem of low luminescence efficiency can be solved by using the embodiments of the disclosure, especially for the OLED emitting blue light which has a relatively low luminescence efficiency. In the OLED display device according to the embodiments of the disclosure, it is easier to implement RGB balance by using the OLED emitting blue light with an improved luminescence efficiency; in addition, an area of the blue sub-pixel can be reduced so that limitation on the design of the drive circuit can be lessened and the OLED display device with a higher resolution can be achieved.

The foregoing embodiments merely are exemplary embodiments of the disclosure, and not intended to define the scope of the disclosure, and the scope of the disclosure is determined by the appended claims.

The disclosure claims priority to and contains subject matters related to that disclosed in Chinese Priority Patent Application CN201410584962.6 filed on Oct. 27, 2014, the entire content of which is hereby incorporated by reference.

What is claimed is:

1. An organic light-emitting device, comprising an anode layer, a cathode layer and an organic function layer disposed between the anode layer and the cathode layer, wherein
the organic function layer comprises a light-emitting layer;
the light-emitting layer comprises a first sub light-emitting layer and a second sub light-emitting layer disposed adjacent to each other, the first sub light-emitting layer is provided on an anode layer side and the second sub light-emitting layer is provided on a cathode layer side;
the first sub light-emitting layer and the second sub light-emitting layer have a substantially same energy band difference, and one of the first sub light-emitting layer and the second sub light-emitting layer is capable of absorbing light emitted by the other of the first sub light-emitting layer and the second sub light-emitting layer to achieve stimulated emission,
wherein, the first sub light-emitting layer is made of a doped host luminescent material having a first doping concentration, and the second sub light-emitting layer is made of the doped host luminescent material having a different, second doping concentration.

2. The organic light-emitting device according to claim 1, wherein
a luminescence efficiency of the second sub light-emitting layer is lower than a luminescence efficiency of the first sub light-emitting layer.

3. The organic light-emitting device according to claim 1, wherein
an emission wavelength of the first sub light-emitting layer is substantially same as an emission wavelength of the second sub light-emitting layer.

4. The organic light-emitting device according to claim 1, wherein
the light-emitting layer further comprises a third sub light-emitting layer disposed adjacent to the second sub light-emitting layer, the third sub light-emitting layer is disposed on the cathode layer side of the second sub light-emitting layer;
the third sub light-emitting layer and the second sub light-emitting layer have a substantially same energy band difference, and one of the second sub light-emitting layer and the third sub light-emitting layer is capable of absorbing light emitted by the other of the second sub light-emitting layer and the third sub light-emitting layer to achieve stimulated emission.

5. The organic light-emitting device according to claim 4, wherein
the third sub light-emitting layer is made of the host luminescent material that is doped, and the doping concentration of the second sub light-emitting layer differs from a doping concentration of the third sub light-emitting layer; or,
the third sub light-emitting layer is made of the host luminescent material.

6. The organic light-emitting device according to claim 1, wherein the organic function layer further comprises a hole transport layer and an electron transport layer, the hole transport layer is adjacent to the first sub light-emitting layer and is provided on the anode layer side, and the electron transport layer is adjacent to the second sub light-emitting layer and is provided on the cathode layer side.

7. The organic light-emitting device according to claim 6, wherein the organic function layer further comprises a hole injection layer and an electron injection layer, the hole injection layer is provided between the hole transport layer and the anode layer, and the electron injection layer is provided between the electron transport layer and the cathode layer.

8. A display device, comprising the organic light-emitting device according to claim 1.

9. A fabrication method for an organic light-emitting device, comprising respectively forming an anode, a light-emitting layer and a cathode, wherein the forming the light-emitting layer comprises:

forming a first sub light-emitting layer, the first sub light-emitting layer being disposed on an anode side;

forming a second sub light-emitting layer adjacent to the first sub light-emitting layer, the second sub light-emitting layer being disposed on a cathode side; and wherein the first sub light-emitting layer and the second sub light-emitting layer have a substantially same energy band difference, and one of the first sub light-emitting layer and the second sub light-emitting layer is capable of absorbing light emitted by the other of the first sub light-emitting layer and the second sub light-emitting layer to achieve stimulated emission, wherein the first sub light-emitting layer is made of a doped host luminescent material having a first doping concentration, and the second sub light-emitting layer is made of the doped host luminescent material having a different, second doping concentration.

10. The fabrication method according to claim 9, wherein the forming the light-emitting layer further comprises: forming a third sub light-emitting layer adjacent to the second sub light-emitting layer, the third sub light-emitting layer being disposed on the cathode side; and wherein the third sub light-emitting layer and the second sub light-emitting layer have a substantially same energy band difference, and one of the second sub light-emitting layer and the third sub light-emitting layer is capable of absorbing light emitted by the other of the second sub light-emitting layer and the third sub light-emitting layer to achieve stimulated emission.

* * * * *